(12) United States Patent
Metzger et al.

(10) Patent No.: US 6,927,649 B2
(45) Date of Patent: Aug. 9, 2005

(54) COMPONENT WORKING WITH ACOUSTIC WAVES AND HAVING A MATCHING NETWORK

(75) Inventors: Thomas Metzger, München (DE); Pasi Tikka, München (DE); Edgar Schmidhammer, Stein (DE); Ralph Stömmer, Neubiberg (DE); Habbo Heinze, Unterschleissheim (DE)

(73) Assignee: Epcos AG, Munich (DE)

( * ) Notice: Subject to any disclaimer, the term of this patent is extended or adjusted under 35 U.S.C. 154(b) by 42 days.

(21) Appl. No.: 10/456,105

(22) Filed: Jun. 6, 2003

(65) Prior Publication Data

US 2003/0227357 A1 Dec. 11, 2003

(30) Foreign Application Priority Data

Jun. 6, 2002 (DE) .......................... 102 25 202

(51) Int. Cl.[7] .............................. H03H 9/54; H03H 9/64; H03H 9/70
(52) U.S. Cl. ...................... 333/133; 333/187; 333/189; 333/193
(58) Field of Search ................................ 333/187–193, 333/133

(56) References Cited

U.S. PATENT DOCUMENTS

| | | | | |
|---|---|---|---|---|
| 3,548,346 A | * | 12/1970 | Page .......................... 333/187 |
| 5,075,641 A | * | 12/1991 | Weber et al. ............ 331/108 C |
| 5,166,646 A | * | 11/1992 | Avanic et al. ............ 331/107 A |
| 5,872,493 A | | 2/1999 | Ella ............................ 333/191 |
| 5,884,378 A | * | 3/1999 | Dydyk ....................... 29/25.35 |
| 6,081,171 A | * | 6/2000 | Ella ............................ 333/189 |
| 6,262,637 B1 | | 7/2001 | Bradley et al. ............. 333/133 |
| 6,297,515 B1 | * | 10/2001 | Yuan ............................. 257/9 |
| 6,407,649 B1 | * | 6/2002 | Tikka et al. ................ 333/133 |
| 6,437,484 B1 | * | 8/2002 | Nishimura et al. ......... 310/324 |
| 6,509,813 B2 | * | 1/2003 | Ella et al. .................... 333/187 |
| 6,741,146 B2 | * | 5/2004 | Ella ............................ 333/133 |
| 2002/0021192 A1 | | 2/2002 | Klee et al. | |

OTHER PUBLICATIONS

D. Penunuri et al.; "RF Filter Design Using LTCC and Thin Film BAW Technology", 2001 IEEE Ultrasonics Symposium; Oct. 2001, vol. 1, pp. 273–278.*

C.W. Seabury et al.; "Thin Film ZnO Based Bulk Acoustic Mode Filters", 1997 IEEE Microwave Symposium Digest; Jun. 1997, vol. 1, pp. 181–184.*

R. Takayama et al.; "High Power Durable Electrodes for GHz Band SAW Duplexers", 2000 IEEE Ultrasonics Symposium; Oct. 2000, vol. 1, pp. 9–13.*

* cited by examiner

*Primary Examiner*—Barbara Summons
(74) *Attorney, Agent, or Firm*—Schiff Hardin LLP

(57) ABSTRACT

A component working with acoustic bulk waves is provided that has a multi-layer substrate, where the multi-layer substrate comprises an integrated matching network and further circuit elements for adapting the electrical filter properties and can serve as carrier substrate for thin-film resonators.

25 Claims, 6 Drawing Sheets

COMPONENT WORKING WITH ACOUSTIC WAVES AND HAVING A MATCHING NETWORK

BACKGROUND OF THE INVENTION

1. Field of the Invention

The invention is directed to a component working with acoustic bulk waves, particularly a bandpass filter or a duplexer having an electronic matching network.

2. Description of the Related Art

Components that work with acoustic bulk waves are bulk acoustic wave components (BAW) components that comprise individual thin-film resonators (also called thin film bulk acoustic wave resonator (FBAR)). In the future, these components will become of great significance as filters and duplexers in front-end modules of wireless communication systems.

A duplexer represents an electrical three-port structure that connects the antenna both to the transmission path as well as to the reception path of a terminal for mobile communication. A duplexer is composed of two bandpass filters to be connected to an antenna that are usually arranged in a common housing, in which one filter is located in the transmission path and another filter is located in the reception path.

On the one hand, a duplexer should comprise a good matching to the environment in each of the pass bands at the corresponding side of the three-port structure in order to minimize signal losses at the interface and, on the other hand, should assure a high suppression of the transmission signals in the reception path and, above all, of the transmission signals in the reception path. Another demand made of a duplexer is a high transmission power compatibility without deteriorating the filter function during a given service life of the component. These factors should all be balanced against minimizing the space requirement.

Up to now, for example, duplexers of microwave ceramic are known that comprise a high power compatibility given low manufacturing costs that, however, are relatively large compared, for instance, to duplexers constructed on the basis of surface acoustic wave (SAW) technology. Although the SAW duplexers are in turn small, they are not especially power-resistant, which is problematic especially in the frequency range above 1 GHz.

U.S. Pat. No. 6,262,637 discloses a BAW duplexer that is composed of two separate bandpass filters for the transmission and reception domain. Both filters are soldered on a printed circuit board and electrically connected to an additional circuit of discrete elements that is likewise applied on the printed circuit board, so that the overall structure can be considered to be a three-port structure. Each of these BAW filters is composed of a ladder-type arrangement of individual acoustic resonators. Each resonator contains a piezoelectric layer that has both sides provided with electrode layers in which a cavity for reflecting an acoustic wave back into the resonator is arranged between the multi-layer resonator structure and a carrier substrate lying below this.

These BAW components require an electrical matching network for matching to their circuit environment, as already indicated above. Such a matching network can comprise inductors, capacitors and delay lines and primarily serves for matching the impedance of a component to the outside environment.

It is known that a BAW component (for example, a duplexer constructed of BAW components) can be provided with a matching network arranged on a printed circuit board (see U.S. Pat. No. 6,262,637). Due to a high space requirement and due to high manufacturing costs, however, such an arrangement is disadvantageous compared to currently available duplexers. Moreover, the electrical properties of such a component are very sensitive with respect to the relative, mutual arrangement of the filter and matching elements required for the duplexer function that are arranged on the printed circuit board.

It is known that matching networks in BAW components are implemented as integrated networks in which the circuit elements forming the network are integrated together in a multi-layer substrate. For example, the integrated circuit elements can be a component part of a duplexer circuit.

It is known that a SAW component (chip) having a multi-layer carrier substrate (of, for example, ceramic) that comprises integrated matching elements can be secured and electrically connected using a flip-chip arrangement or by wire bonding. One disadvantage of SAW components is that they have a short service life given high transmission power applied in terminals of mobile communication. A further disadvantage of the SAW duplexers is that the edges of the pass bands do not drop off steeply enough in their transfer function, for example, which is why SAW duplexers are not considered for applications with a slight spacing between the center frequencies of the transmission and reception domains.

SUMMARY OF THE INVENTION

An object of the present invention is to provide a component working with acoustic waves and having integrated circuit elements that comprises high power compatibility and dependability of electrical properties.

An inventive, electronic component working with acoustic bulk waves (BAW component) comprises:

a) at least one thin-film resonator, also called a bulk wave resonator or FBAR (thin film bulk acoustic wave resonator) that is formed of at least one piezoelectric layer with at least two electrodes applied in layers, and b) a multi-layer substrate having at least one integrated passive or active circuit element.

DESCRIPTION OF THE DRAWINGS

The invention is explained in greater detail below on the basis of exemplary embodiments and the appertaining Figures. The Figures thereby only serve for explanation and are only schematic and not to-scale. Identical elements are referenced with the same reference characters.

DETAILED DESCRIPTION OF THE PREFERRED EMBODIMENTS

Various terminology is used to describe the preferred embodiments. What are understood by integrated circuit elements in the sense of the invention are circuit elements that are monolithically integrated in the multi-layer substrate.

What are particularly meant by a passive or active circuit element in the sense of the invention are an inductance, a capacitor, a delay line, a resistor, a diode or a transistor. These circuit elements are preferably fashioned in a known way as interconnects or arbitrarily shaped metal surfaces between the individual layers of the multi-layer substrate (substrate layers) or as vertical interlayer connections in the multi-layer substrate. The at least one thin-film resonator may be arranged on the upper side of the multi-layer substrate and electrically connected to the circuit elements integrated in the multi-layer substrate. These circuit elements can form various electronic circuits, and these circuits can also contain at least one thin-film resonator. This can be a matter, for example, of a filter circuit with ladder-type arrangement that contains integrated inductances in parallel branches.

What is meant by a chip component is a "naked" chip with electronic structures or a housed chip with such structures. What is meant by a filter in the sense of the invention is a filter circuit realized, for example, on a chip component. A filter chip is a chip with filter sub-structures.

A duplexer is a component that comprises both filter structures realized on a chip as well a multi-layer substrate with integrated circuit elements.

Compared to a solution with circuit elements, particularly matching elements, attached on a printed circuit board, the solution with circuit elements integrated in a multi-layer substrate offers particular advantages not only in view of reducing the space requirement but also in view of an especially high dependability of electrical properties of the component as a result of high precision (low manufacturing tolerances) in the production of the metallization between substrate layers.

The advantage of the inventively component with thin-film resonators compared to a SAW component with circuit elements integrated in a multi-layer substrate is that the former exhibits a significantly higher power compatibility.

Integrated circuit elements can form at least a part of the following circuits: matching network, antenna switch, diode switch, high-pass filter, low-pass filter, bandpass filter, band elimination filter, power amplifier, diplexer, duplexer, coupler, directional coupler, memory elements, balun, and mixer.

Various embodiments of the invention may be considered. The multi-layer substrate with integrated circuit elements can directly serve as a carrier substrate for the at least one thin-film resonator. A further possibility is to electrically connecting one or more chips, which are composed of a carrier substrate with thin-film resonators deposited thereon, to the multi-layer substrate using a wire bonding or flip-chip technique. A direct deposition of thin-film resonators, however, is more cost-beneficial since additional process steps, i.e., wire bonding or flip-chip bonding, are eliminated in this case.

The multi-layer substrate comprises both an internal electrical terminal at the upper side for contacting with the thin-film resonators and, potentially, with further discrete circuit elements as well as outside electrodes, for example, at the underside, for producing an electrical connection of the component part to an external printed circuit board, for example, that of a terminal device.

The integrated circuit elements can, for example, realize electrical connections between an antenna and bandpass filters in the reception or transmission path of an inventive component fashioned, for example, as duplexer and can additionally serve for improving electrical filter properties in general and, specifically, the isolation of reception and transmission ports from one another.

Given connection of a reception or transmission filter with an antenna in a duplexer, a phase shift of the corresponding signals can become necessary. The phase shift can be achieved by a delay line or by a combination of the inductances and capacitances. For example, these circuit elements can be arranged between the antenna port and the reception filter, where the transmission filter is directly connected to the antenna port. It is also possible to arrange these circuit elements between the transmission filter and the reception filter.

The value of a phase shift to be achieved, for example, by a delay line is dependent on input or output impedance at the reception or transmission port (that is connected, on the one hand, to the phase shift circuit and, on the other hand, to the antenna port). The phase of the (complex) input or output impedance of a filter (having, for example, a ladder-type arrangement) is dependent on the exact filter topology, i.e., it is dependent on whether the first thin-film resonator is arranged in a series branch or in a parallel branch as viewed proceeding from the corresponding port. For example, it can be advantageous to replace a resonator with a combination of two or more series-connected resonators in order to increase the power resistance of the component in a signal path to which high powers are applied during operation.

The integrated circuit elements are preferably arranged on, in, and between the layers of a multi-layer ceramic, for example, a low temperature co-fired ceramic (LTCC) ceramic. Such a ceramic in LTCC implementation allows a high integration of network elements. Since a high-grade ceramic and low-loss metallic conductors are employed in this technique given an exactly reproducible component geometry or network geometry at the same time, the inventive solution—compared to a BAW component with a matching network externally constructed of discrete elements—exhibits less variation of electrical properties of the matching elements and, consequently, fewer deviations of the transmission parameters of the overall component.

As an alternative to this, a multi-layer substrate can be composed of high temperature co-fired ceramic (HTCC), silicon, or organic materials (for example, laminates, plastic) or can comprise individual layers of these materials.

This multi-layer substrate can simultaneously be part of a housing that surrounds the inventive component.

In an advantageous embodiment of an inventive component, a thin-film resonator can be provided with one or more acoustic mirrors. The employment of an acoustic mirror offers additional degrees of freedom in the filter design since the properties of such a mirror influence the properties of a thin-film resonator and the characteristics of a filter constructed of thin-film resonators.

For example, unwanted acoustic modes in the resonator can be suppressed by the corresponding setting of the frequency ranges of an acoustic mirror. The unwanted modes are conducted out from the resonator in the direction of the carrier substrate without deteriorating the filter characteristic.

The reflection behavior of an acoustic mirror can be adapted by utilizing a suitable selection and/or plurality of layers or layer pairs forming the acoustic mirror such that the effective coupling constant of a thin-film resonator arranged above it assumes the desired value. A higher edge steepness of a bandpass filter can be achieved with a smaller coupling constant of a thin-film resonator (high edge steepness is required in some duplexer applications with a slight spacing between the reception band and transmission band). Each individual layer of an acoustic mirror influences the resonant frequency of the thin-film resonator connected to it. The resonant frequencies can therefore be controlled by varying the layer thicknesses of one or more layers as well as by inserting additional layers or eliminating layers that already exist, which can be beneficial for the adaptation of the resonant frequencies of individual filters or resonators or can also be beneficial for necessary frequency shifting between thin-film resonators in series or parallel branches of a filter arrangement.

Differing from BAW components known from the prior art, which comprise no acoustic mirror between the thin-film resonator and a carrier substrate, so that the thin-film resonator hangs freely over the carrier substrate, a direct thermal contact between the carrier substrate and the resonator layers is assured by an acoustic mirror given an inventive component. The heating of the electrodes of the thin-film resonator can be significantly reduced as a result given employment of high transmission powers.

Compared to duplexers on the basis of BAW technology that are already commercially available, the inventive component offers more degrees of design freedom, a higher power compatibility as well as a higher quality of acoustic resonators, which leads to a better filter quality, i.e., lower losses and a higher edge steepness of the transmission function outside the pass band. The integration of the circuit elements in a multi-layer substrate given an inventive BAW component—as already mentioned above—assures lower manufacturing tolerances and, thus, more stable transmission parameters of the overall filter compared to solutions that already exist. The invention also allows cost-beneficial BAW components to be manufactured with low space requirements.

The following detailed explanation of the general features of the multi-layer structure of an inventive BAW component are described below on the basis of FIG. 1.

Figure 1:
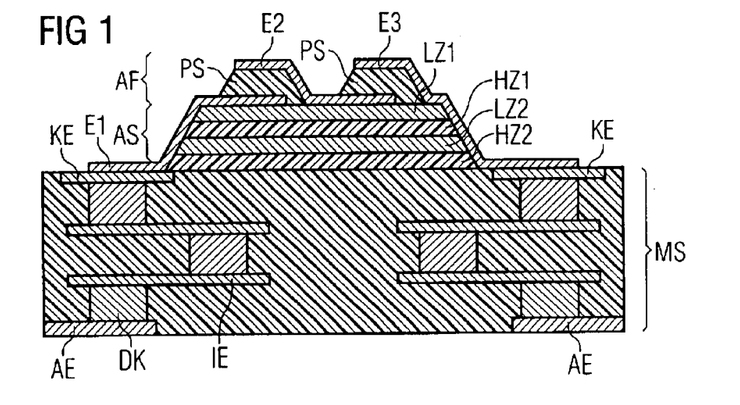
FIG. 1 is a side view showing the fundamental layer structure of an inventive component in a schematic crossection.
Figure 1A:
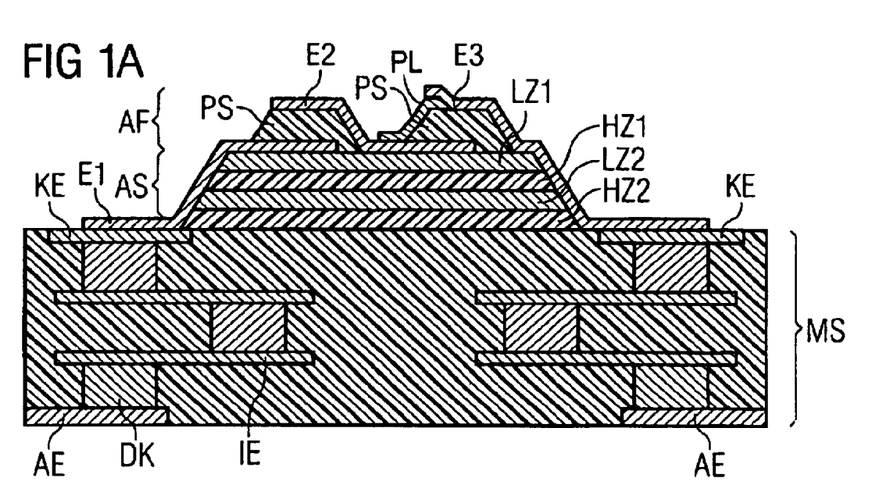
FIG. 1A is a side view showing the inclusion of a passivation layer.

The component shown in FIG. 1 is constructed as a multi-layer component with a multi-layer substrate MS, where one or more thin-film resonators AF provided with an acoustic mirror are arranged at the upper side of the multi-layer substrate. For example, two thin-film resonators are shown in FIG. 1. Each thin-film resonator AF comprises a piezoelectric layer PS and two electrodes E1 and E2, or E2 and E3. In an advantageous embodiment, one component can comprise a plurality of piezoelectric layers or more than two electrodes per single piezoelectric layer. The electrodes can in turn have a layer structure composed of a plurality of layers of different materials.

Fundamentally, electrodes can be composed of arbitrary conductive materials. The most important requirements for the electrode material are: a) good electrical conductivity in order to reduce ohmic losses, and b) high power compatibility. Furthermore, the electrode material should be suitable as an base for further layers lying above it and below it in order to achieve better properties of those layers such as, for example, texture, layer stress, surface roughness, and crystallite size or density. The coupling coefficient of a piezoelectric layer can be increased by employing suitable electrode materials. The frequency separation between resonance and anti-resonance of a thin-film resonator and, consequently, the bandwidth of an inventive band pass filter (with, for example, a ladder-type arrangement) can therefore be increased. In order to meet all of these demands, it can be useful to fabricate the electrodes as a metal alloy or composed of a plurality of layers of different materials.

The acoustic mirror AS may be arranged between a thin-film resonator AF and the multi-layer substrate MS. The acoustic mirror may be composed of a plurality of alternating layers with high—HZ1, HZ2—and low—LZ1, LZ2—acoustic impedance, where the layer thickness of each of these layers HZ1, HZ2, LZ1, LZ2 amounts to approximately one-fourth of the wavelength for the acoustic wave in the respective material. At the same time, an electrically conductive layer of the acoustic mirror can represent an electrode of the appertaining thin-film resonator, or an electrode of suitable thickness and impedance can be a sub-layer of the acoustic mirror.

In the stop band, the acoustic mirror prevents the emergence of acoustic waves that have arisen in the thin-film resonator in the direction of the multi-layer substrate, which would produce unwanted energy losses.

The composition and the exact structure of the acoustic mirror, together with the thickness and the material properties of the piezoelectric layer or of the electrodes of a thin-film resonator, define its static capacitance.

The reflection coefficient at the boundary surface between two layers employed in an acoustic mirror having a low and a high acoustic impedance is mainly defined by the difference between the values of these acoustic impedances.

The high reflection coefficient of the overall acoustic mirror can, for example, be achieved with only one pair of layers composed of different materials when the first layer comprises a very high impedance value and the second layer comprises a very low impedance value. Tungsten, for example, can be used as first layer; a material having a low dielectric constant, a low density and a low modulus of elasticity can serve as second layer. An acoustic mirror having a broadband stop band characteristic is realized by such a structure.

An acoustic mirror with a narrowband stop band characteristic, in contrast, is formed with a plurality of alternating layers. The respective layers should comprise a reasonably high or low acoustic impedance. AlN can serve as a first material; amorphous silicon can serve as the second. Fundamentally, an arbitrary combination of materials with a high or low value of acoustic impedance in combination with the prescribed plurality of layer pairs can be employed in order to achieve the required reflection coefficient and the required bandwidth of the acoustic mirror.

When electrically conductive layers, for example tungsten, are employed in the acoustic mirror, then this layer should be structured, i.e., limited to the area under each and every thin-film resonator, in order to keep unwanted capacitative coupling between individual thin-film resonators of a filter within limits. When the acoustic mirror is composed exclusively of dielectric layers, then all layers can remain unstructured.

Given acoustic mirrors with a broad stop band characteristic, the same mirror that is built up on a wafer can be employed both for a band pass filter in the reception path as well as for such a filter in the transmission path of a duplexer. These band pass filters can be deposited on the same wafer in the same process step, since an acoustic mirror with a great bandwidth assures an adequately high reflection coefficient in the pass band of both band pass filters.

A plurality of thin-film resonators can, for example, form a band pass filter with a ladder-type or lattice-type arrangement. Also possible are a filter arrangement of stacked thin-film resonators (a "stacked crystal filter" (SCF) filter arrangement), or a filter arrangement of coupled thin-film resonators: coupled resonator filter (CRF) filter arrangement. A filter arrangement can also comprise arbitrary combinations of these filter arrangements.

The ladder-type or lattice-type filter arrangements is explained below with reference to the example of a filter having a symmetrical input and output.

In a symmetrical ladder-type filter, the reactance elements, for example, the inventive thin-film resonators, are arranged in two serial branches that are bridged ladder-like with parallel branches. Given a symmetrical lattice filter, the reactance elements are arranged in two serial branches that are bridged cross-like with parallel branches. Each of these two basic filter types exhibits specific filter properties. As a particular advantage, the ladder type filter comprises step edges in the transition range and deeply extending pole locations (notches), whereas a lattice type filter has the particular advantages of a low insertion attenuation and a low pass band ripple connected with extremely high stop band suppression.

Inductances or capacitances employed in the serial or parallel branches of a filter arrangement for adapting the filter properties can be integrated in the multi-layer substrate MS. These circuit elements can be connected to individual thin-film resonators both parallel as well as in series.

A serially connected inductance (e.g., an inductance integrated in the multi-layer substrate), with an acoustic resonator in the parallel branch of a ladder-type arrangement creates an additional pole (or zero) location the transfer function of a ladder-type filter. The filter characteristic in the stop band can be significantly improved by using a suitable selection of the plurality and of the frequency position of these zero locations. Moreover, the spacing between resonance and anti-resonance of a thin-film resonator can be increased by shifting the resonance to lower frequencies, which can be utilized for realizing a higher filter bandwidth. Additional inductances that are connected in series with the filter input or output can serve for achieving the required input or output impedance of a filter (for example, 50 ohms) because capacitative properties of a ladder-type filter constructed of thin-film resonators can be compensated by this. A better internal matching of individual elements of the arrangement can be achieved as a result of inserting an inductance between two resonators of a ladder-type arrangement, where the inductances can be inventively fashioned as integrated circuit elements.

An individual thin-film resonator in the ladder-type arrangement can be replaced by a cascade of n series-connected resonators, where each of the new thin-film resonators comprises an acoustic area approximately n times as large (compared to the acoustic area of the resonator to be replaced), so that the original static capacitance is preserved. This procedure can be advantageous for reasons of power compatibility or for adhering to the minimum possible resonator size.

In addition to thin-film resonators, further passive or active, discrete circuit elements or other structures (e.g., SAW filters) can be arranged on the upper side of the multi-layer substrate. Moreover, these circuit elements can form parts of the following circuits: matching network, band pass filter, band elimination filter, power amplifier, diplexer, duplexer, coupler, directional coupler, memory elements, balun, and mixer.

A multi-layer substrate MS comprises integrated circuit elements IE that are electrically connected to outside electrodes AE and to individual thin-film resonators AF via feedthroughs DK, for example, via contact electrodes KE. The multi-layer substrate can, for example, be composed of ceramic, silicon or organic materials.

Additional passivation layers (for example, $SiO_2$, $Si_3N_4$, BCB=benzo cyclo butane) disclosed by International Patent Publications WO 0106646 and WO 0106647 can be provided for the passivation of the electrodes or for the frequency tuning of the filter. The passivation layer is preferably the uppermost layer in the layer structure of a thin-film resonator or is arranged on the upper electrode layer of the resonator. The passivation layer is preferably fashioned over a large-area and covers all layers of the resonator lying below it. It is also possible to fashion the passivation layer structured and to only cover selected regions of the upper electrode layer (when, for example, the passivation layer is only arranged over the active resonator zones). The frequency tuning (trimming) of the filter or of the thin-film resonators ensues by varying the layer thickness of the passivation layer, preferably by eroding a part of the passivation layer.

It is possible that a plurality of circuits constructed of individual thin-film resonators (e.g., filters, particularly band pass filters) are realized directly on a multi-layer substrate.

Figure 6:
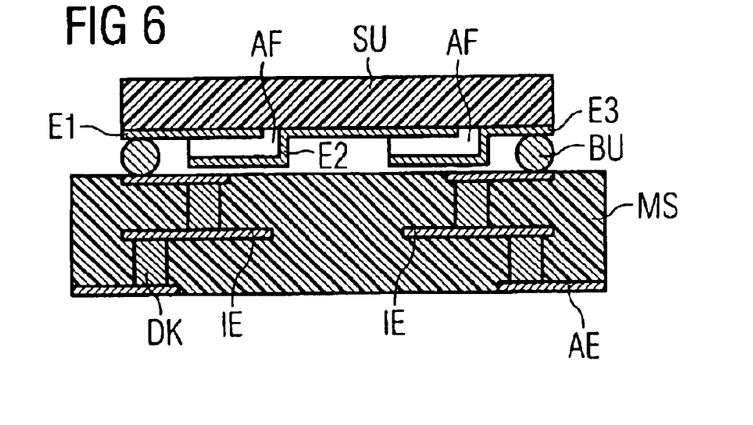
FIG. 6 is a side view showing a further exemplary embodiment of inventive components in schematic crossection.
Figure 7:
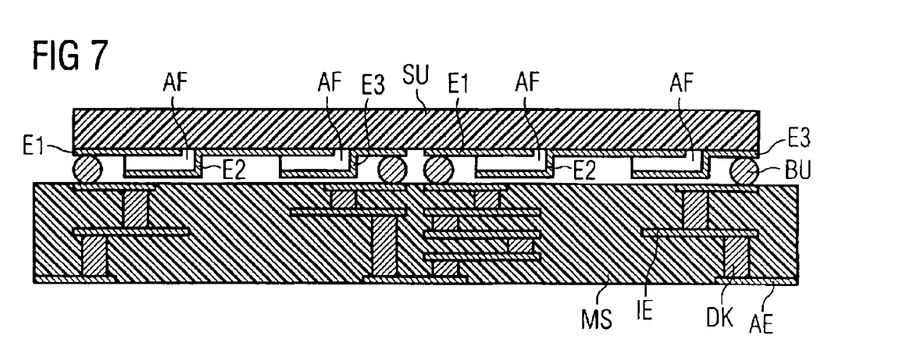
FIG. 7 is a side view showing a further exemplary embodiment of inventive components in schematic crossection.

It is possible that a plurality of circuits constructed of individual thin-film resonators (e.g., filters, particularly band pass filters) are realized on a common carrier substrate SU, as indicated in FIGS. 6 and 7. The carrier substrate with the thin-film resonators forms a chip that can be joined to the multi-layer substrate and the circuit elements integrated therein, for example, with wire bonding or flip-chip technique.

The carrier substrate SU can in turn have a multi-layer structure or comprise one or more integrated circuit elements, particularly matching elements.

Figure 8:
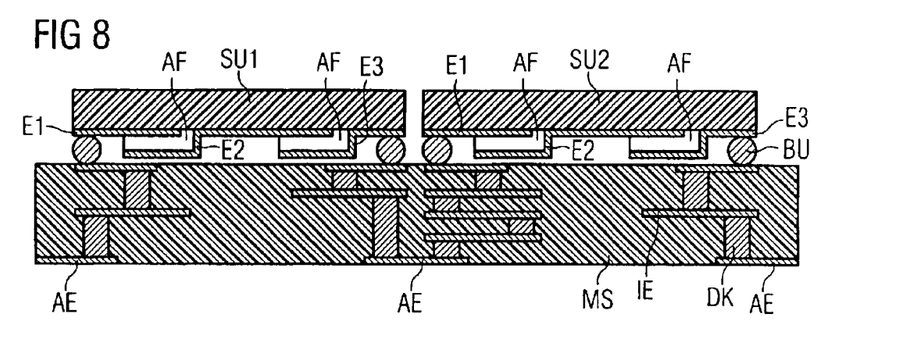
FIG. 8 is a side view showing a further exemplary embodiment of inventive components in schematic crossection.

Another possibility for variation is that a plurality of circuits constructed of individual thin-film resonators (e.g., filters, particularly band pass filters) are arranged separately—each on its own carrier substrate SU1, SU2—in a common housing on the upper side of the multi-layer substrate MS, as indicated in FIG. 8. Each carrier substrate with the thin-film resonators forms a chip that can be joined to the circuit elements integrated in the multi-layer substrate, for example, with wire bonding or flip-chip technique.

It is possible that a plurality of circuits constructed of individual thin-film resonators (e.g., filters, particularly band pass filters) are separately arranged on the surface of the multi-layer substrate—each on its own carrier substrate and in its own housing. Each carrier substrate with the thin-film resonators forms a chip that can be joined to the circuit elements integrated in the multi-layer substrate, for example, with wire bonding or flip-chip technique.

Figure 2:
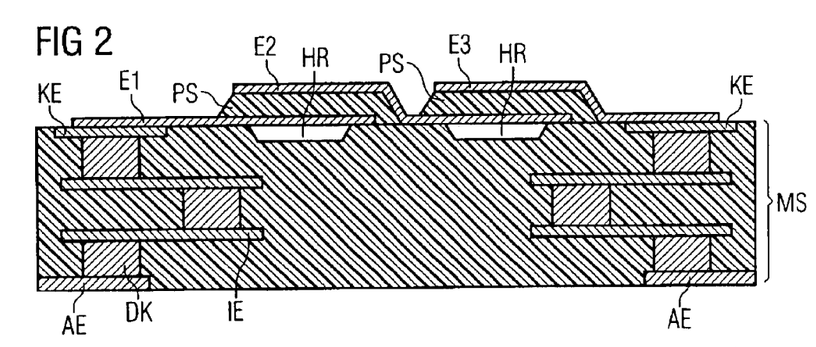
FIGS. 2–3 are side views showing the layer structure of advantageous embodiments of an inventive component in schematic crossection.

FIG. 2 shows a further possible embodiment of an inventive component. In this case, thin-film resonators AF are arranged on the multi-layer substrate MS without an acoustic mirror such that there is a cavity HR between the acoustically active surface of the resonator and the multi-layer substrate. The solution with an acoustic mirror, however, offers a higher power compatibility because of a better thermal contact with the multi-layer substrate as well as more degrees of design freedom.

Figure 3:
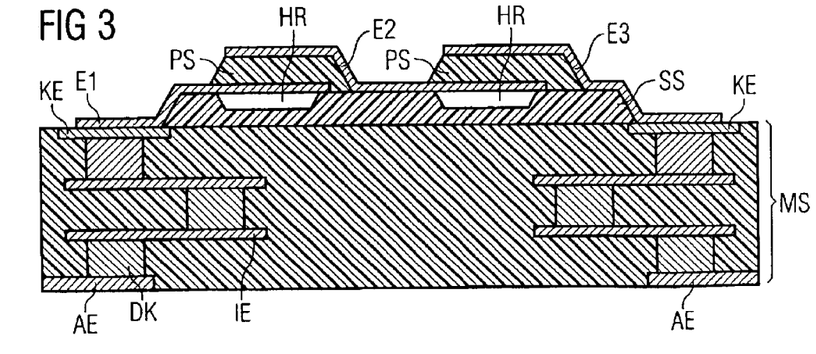

FIG. 3 shows another possibility of how a thin-film resonator can be arranged on a multi-layer substrate without acoustic mirrors. Differing from the component described in FIG. 2, a multi-layer substrate comprises an additional substrate layer SS that, for example, can be composed of a different material, this layer lying between the multi-layer substrate MS and thin-film resonators AF.

Figure 4:
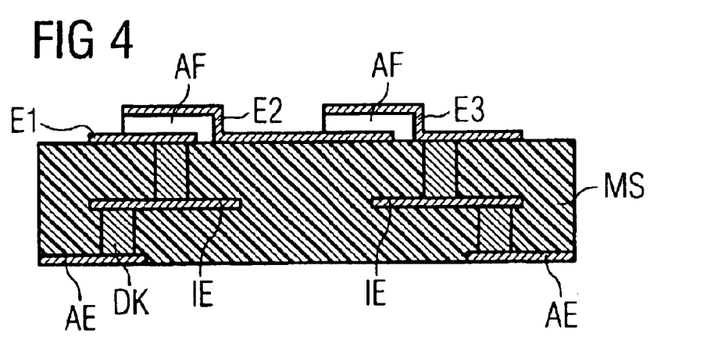
FIG. 4 is a side view showing a schematic crossection of an inventive filter with thin-film resonators deposited directly on the multi-layer substrate.

FIG. 4 shows a schematic crossection through an inventive component with thin-film resonators AF deposited directly on the multi-functional multi-layer substrate MS. The multi-layer substrate serves as carrier substrate for thin-film resonators. It is also possible to fashion a duplexer in this way.

Figure 5:
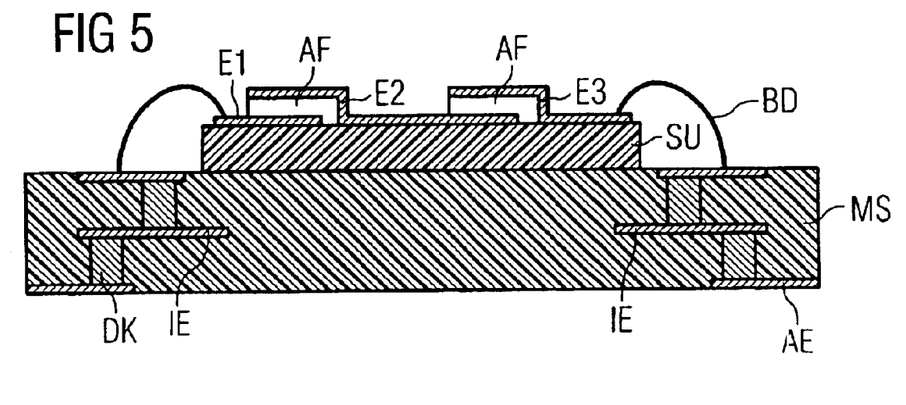
FIG. 5 is a side view showing a further exemplary embodiment of inventive components in schematic crossection.

FIG. 5 shows another possibility of how thin-film resonators AF can be arranged on a multi-layer substrate MS with integrated circuit elements IE. Individual thin-film resonators AF are deposited in layers on a carrier substrate SU whose underside lies on the upper side of a multi-layer substrate MS. The electrical connections between the individual thin-film resonators AF and the integrated circuit elements present in the multi-layer substrate are provided by bond wires BD.

Individual thin-film resonators are usually arranged such that they form one or more band pass filters. The inductances of the bond wires, for example, can thereby be employed as inductivity elements in the serial or parallel branches of a ladder-type arrangement of the thin-film resonators.

Figure 5A:
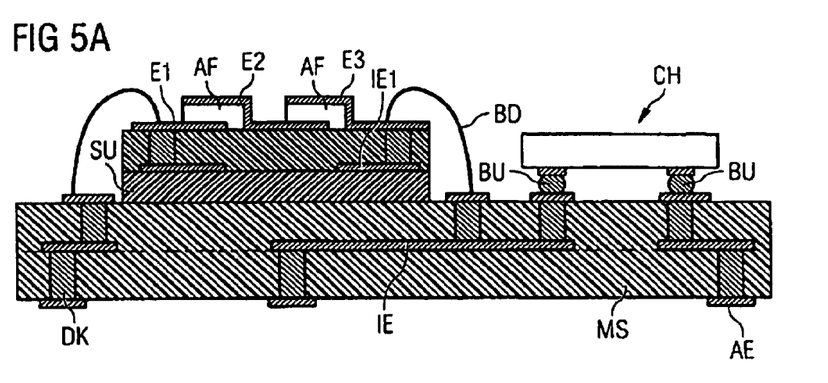
FIG. 5A is a side view showing the embodiment according to FIG. 5 in schematic crossection in which a carrier substrate comprises a multilayer structure.

FIG. 5A shows an embodiment according to FIG. 5 wherein a carrier substrate SU comprises a multi-layer structure. Integrated circuit elements IE1 are arranged in the carrier substrate SU. A filter chip CH, such as a SAW filter chip, is mounted on the surface of the multi-layer substrate MS.

FIG. 6 shows a further fastening possibility for individual thin-film resonators deposited on the underside of a carrier substrate SU on a multi-layer substrate MS by a flip-chip technique. The carrier substrate with acoustic structures is mechanically secured on the upper side of the multi-layer substrate MS using bumps BU and is electrically connected to circuit elements integrated in the multi-layer substrate. The bumps can, for example, be composed of solder.

Figure 6A:
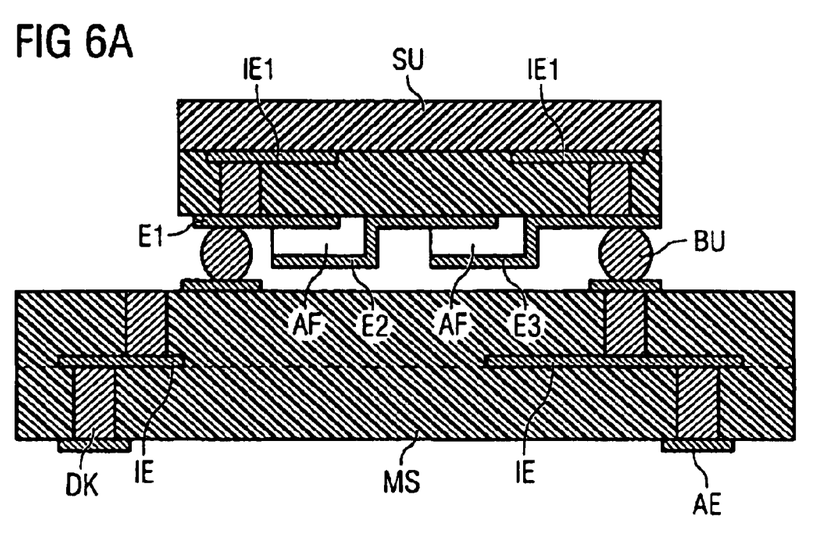
FIG. 6A is a side view showing the embodiment according to FIG. 6 in schematic crossection in which a carrier substrate comprises a multilayer structure.

FIG. 6A shows an embodiment according to FIG. 6 wherein a carrier substrate SU comprises a multi-layer structure. Integrated circuit elements IE1 are arranged in the carrier substrate SU.

FIG. 7 shows a further exemplary embodiment of an inventive duplexer. Individual thin-film resonators AF form two band pass filters, as shown and explained in FIG. 6. The band pass filters are arranged in the reception and transmission path of the duplexer next to one another on a carrier substrate SU and are separated from one another by middle bump rows. A spatial separation of reception and transmission path serves for a better signal suppression of the opposite band. However, it is possible to forego the middle bump rows.

An exemplary embodiment of an inventive component fashioned as duplexer that is shown in FIG. 8 differs from the component that was just described insofar as the band pass filters in the reception and transmission path of the duplexer are arranged on different carrier substrates SU1 or SU2. The filters constructed on carrier substrates SU1 and SU2 can be housed either in common or separately.

Figure 9:
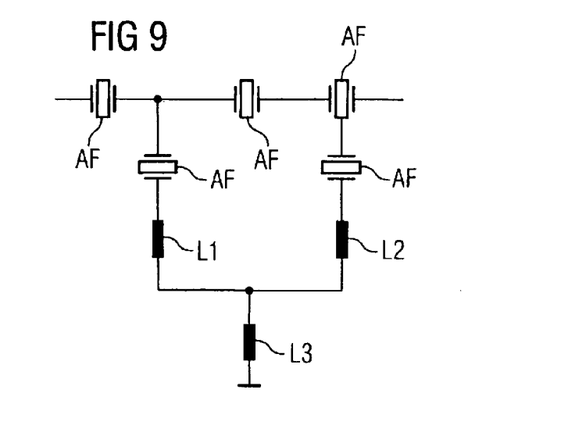
FIG. 9 is a filter circuit schematic showing a ladder-type arrangement with integrated inductances.

FIG. 9 shows an exemplary equivalent circuit of a filter with ladder-type arrangement comprising a plurality of thin-film resonators with inductances L1, L2 and L3 integrated in the multi-layer substrate in the parallel branches of the filter. Other circuit elements integrated in the multi-layer substrate can also be present both in the parallel branches as well as in the series branches of the filter.

FIGS. 4 through 8 show the thin-film resonators AF without an acoustic mirror. Another variation could be to arrange an acoustic mirror between the thin-film resonators and the multi-layer substrate MS or the carrier substrate SU.

It is possible that a plurality of circuits comprising thin-film resonators (e.g., filter circuits, particularly band pass filters) are realized on a common carrier substrate or directly on a multi-layer substrate.

It is possible that a plurality of circuits comprising thin-film resonators (e.g., filter circuits, particularly band pass filters) are arranged separately—each on its own carrier substrate—in a common housing on the upper side of the multi-layer substrate.

It is also possible that a plurality of circuits comprising thin-film resonators (e.g., filter circuits, particularly band pass filters) are arranged separately—each on its own carrier substrate and in its own housing—on the upper side of the multi-layer substrate.

For the purposes of promoting an understanding of the principles of the invention, reference has been made to the preferred embodiments illustrated in the drawings, and specific language has been used to describe these embodiments. However, no limitation of the scope of the invention is intended by this specific language, and the invention should be construed to encompass all embodiments that would normally occur to one of ordinary skill in the art.

The particular implementations shown and described herein are illustrative examples of the invention and are not intended to otherwise limit the scope of the invention in any way. For the sake of brevity, conventional electronics and other functional aspects of the systems (and components of the individual operating components of the systems) may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device. Moreover, no item or component is essential to the practice of the invention unless the element is specifically described as "essential" or "critical". Numerous modifications and adaptations will be readily apparent to those skilled in this art without departing from the spirit and scope of the present invention.

What is claimed is:

1. A component working with acoustic bulk waves, comprising:
    at least one thin-film resonator, comprising:

at least one piezoelectric layer and
at least two electrodes applied in layers;
the component further comprising:
a multi-layer substrate comprising:
an upper side upon which the at least one thin-film resonator is arranged;
outside electrodes; and
at least one integrated passive or active circuit element to which the at least one thin-film resonator is electrically connected;
the component further comprising:
at least one chip component arranged on the upper side of the multi-layer substrate in addition to the at least one thin-film resonator,
wherein the at least one chip component is a filter chip.

2. The component according to claim 1, wherein the at least one integrated circuit element forms at least a part of a matching network.

3. The component according to claim 1, wherein a part of the at least one circuit element is arranged on the upper side of the multi-layer substrate as interconnects.

4. The component according to claim 1, further comprising:
at least one discrete passive or active circuit element arranged on the upper side of the multi-layer substrate.

5. The component according to claim 1, wherein a plurality of thin-film resonators form band pass filters with a ladder-type arrangement.

6. The component according to claim 1, further comprising:
at least one acoustic mirror that comprises a plurality of alternating layers with high and low acoustic impedance.

7. The component according to claim 1, wherein the at least one filter chip is a surface acoustic wave (SAW) component.

8. The component according to claim 1, wherein the multi-layer substrate comprises ceramic layers.

9. The component according to claim 1, wherein the multi-layer substrate comprises layers of silicon.

10. The component according to claim 1, wherein the multi-layer substrate comprises layers of an organic material.

11. The component according to claim 10, wherein the multi-layer substrate comprises layers of an organic laminated material.

12. The component according to claim 10, wherein the multi-layer substrate comprises layers of an organic plastic material.

13. The component according to claim 1, further comprising:
a multi-layer substrate with the integrated circuit elements upon which the layers of the at least one thin-film resonator are directly deposited.

14. The component according to claim 1, further comprising:
a carrier substrate upon which the layers of the at least one thin-film resonator are deposited.

15. A component working with acoustic bulk waves, comprising:
at least one thin-film resonator, comprising:
at least one piezoelectric layer and
at least two electrodes applied in layers;
the component further comprising:
a multi-layer substrate comprising:
an upper side upon which the at least one thin-film resonator is arranged;
outside electrodes; and
at least one integrated passive or active circuit element to which the at least one thin-film resonator is electrically connected;
the component further comprising:
a carrier substrate upon which the at least one thin-film resonator is deposited, the at least one thin-film resonator being electrically connected with bond wires to the at least one circuit element integrated in the multi-layer substrate, the carrier substrate being arranged on an upper side of the multi-layer substrate.

16. The component according to claim 15, wherein a plurality of thin-film resonators form a serial cascade circuit of a plurality of thin-film resonators for assuring a higher power compatibility of the component.

17. The component according to claim 15, wherein the carrier substrate comprises a multi-layer structure.

18. The component according to claim 17, wherein the carrier substrate with a multi-layer structure comprises at least one integrated circuit element.

19. A component working with acoustic bulk waves, comprising:
at least one thin-film resonator, comprising:
at least one piezoelectric layer and
at least two electrodes applied in layers;
the component further comprising:
a multi-layer substrate comprising:
an upper side upon which the at least one thin-film resonator is arranged;
outside electrodes; and
at least one integrated passive or active circuit element to which the at least one thin-film resonator is electrically connected;
the component further comprising:
a cavity located between an active region of the at least one thin film resonator and the multi-layer substrate.

20. A component working with acoustic bulk waves, comprising:
at least one thin-film resonator, comprising:
at least one piezoelectric layer and
at least two electrodes applied in layers;
the component further comprising:
a multi-layer substrate comprising:
an upper side upon which the at least one thin-film resonator is arranged;
outside electrodes; and
at least one integrated passive or active circuit element to which the at least one thin-film resonator is electrically connected;
the component further comprising:
a carrier substrate upon which the at least one thin-film resonator is deposited, the at least one thin-film resonator being electrically connected with bond wires to the at least one circuit element integrated in the multi-layer substrate, the carrier substrate being arranged on an upper side of the multi-layer substrate, the carrier substrate being connected to the multi-layer substrate via a flip-chip technique;
wherein the carrier substrate comprises a multi-layer structure.

21. The component according to claim 20, wherein the carrier substrate with a multi-layer structure comprises at least one integrated circuit element.

22. A component working with acoustic bulk waves, comprising:
at least one thin-film resonator, comprising:

at least one piezoelectric layer and
at least two electrodes applied in layers;
the component further comprising:
a multi-layer substrate comprising:
an upper side upon which the at least one thin-film resonator is arranged;
outside electrodes; and
at least one integrated passive or active circuit element to which the at least one thin-film resonator is electrically connected;
wherein a plurality of circuit elements integrated in the multi-layer substrate form a part of a duplexer circuit.

23. The component according to claim 22, further comprising:
two separate carrier substrates in two separate housings upon which are arranged, on an upper side of the multi-layer substrate, band pass filters constructed of a plurality of thin-film resonators in the reception path and transmission path of the duplexer.

24. The component according to claim 22, wherein band pass filters constructed of a plurality of thin-film resonators in the reception path and transmission path of the duplexer are realized on a carrier substrate or directly on the multi-layer substrate.

25. The component according to claim 22, further comprising:
two separate carrier substrates in a common housing upon which are arranged, on an upper side of the multi-layer substrate, band pass filters constructed of a plurality of thin-film resonators in the reception path and transmission path of the duplexer.

* * * * *